(12) United States Patent
Huang

(10) Patent No.: US 7,498,885 B2
(45) Date of Patent: Mar. 3, 2009

(54) VOLTAGE CONTROLLED OSCILLATOR WITH GAIN COMPENSATION

(75) Inventor: Mu-Jen Huang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 155 days.

(21) Appl. No.: 11/592,453

(22) Filed: Nov. 3, 2006

(65) Prior Publication Data
US 2008/0106345 A1 May 8, 2008

(51) Int. Cl.
*H03L 7/00* (2006.01)
(52) U.S. Cl. .................. 331/16; 331/185; 331/175; 331/57
(58) Field of Classification Search .............. 331/16, 331/34, 1 A, 57, 185, 175
See application file for complete search history.

(56) References Cited

U.S. PATENT DOCUMENTS 6,624,706 B2 * 9/2003 Higashi et al. .......... 331/17
7,391,274 B2 * 6/2008 Hsu ....................... 331/57

* cited by examiner

*Primary Examiner*—Arnold Kinkead
(74) *Attorney, Agent, or Firm*—K & L Gates LLP

(57) ABSTRACT

A voltage controlled oscillator includes at least one input port for receiving a control voltage and at least one voltage-to-current coupled to the input port for generating a control current in response to the control voltage. At least one current controlled oscillator generates an oscillating frequency output in response to the control current. At least one compensation branch is coupled to the voltage-to-current converter for generating a compensation current that increases the control current when the control voltage exceeds a predetermined value.

10 Claims, 4 Drawing Sheets

VOLTAGE CONTROLLED OSCILLATOR WITH GAIN COMPENSATION

BACKGROUND

The present invention relates generally to integrated circuit (IC) designs, and more particularly to a voltage-controlled oscillator (VCO) of a phase-locked loop (PLL) circuit that provides gain compensation for the SS corner in order to improve the phase margin degradation and to improve the circuit area.

PLL circuits are commonly used to generate a high-frequency signal with a frequency being an accurate multiple of the frequency of a reference signal. PLL circuits can also be found in applications where the phase of the output signal has to track the phase of the reference signal, hence the name phase-locked loop. The VCO circuit is the key component used in the PLL circuit.

The VCO circuits generate output frequencies over a wide range in response to a small change in input control voltage, Vc. The ratio of a change in the output oscillator frequency to a change in the input control voltage Vc is known as the VCO gain or Kvco. The gain of a VCO is a factor in the PLL's open loop gain, and therefore can have an effect on the PLL's overall stability.

In simulation, the best-case signal ringing (referred to as an FF corner) and worst-case signal delay (referred to as an SS corner) for VCO circuits are determined. The initials FF and SS refer to the characteristics of the p and n channel transistors, respectively. An FF VCO simulation refers to fast p-channel and n-channel transistors. An SS VCO simulation means that both p-channel and n-channel transistors are slow during the simulation.

For a low voltage VCO design, the Kvco degrades or the frequency saturates at higher voltages for SS corner simulation. To meet the minimum requirement of oscillation frequency for the SS corner, Kvco has to be increased. However, increasing Kvco of the SS corner also increases the Kvco of the FF corner. The stability of the PLL circuit depends on the loop bandwidth and is directly proportional to Kvco. Increasing Kvco of the FF corner causes the capacitance area to increase in order to maintain stability. Due to the frequency saturation of the SS corner, the gain of diversity from the SS corner to the FF corner increases, resulting in phase margin degradation.

As such, it is desirable to have a VOC design with gain compensation that improves the phase margin and reduces the capacitance area.

SUMMARY

The present invention discloses a voltage controlled oscillator. In one embodiment of the invention, the voltage controlled oscillator includes at least one input port for receiving a control voltage and at least one voltage-to-current coupled to the input port for generating a control current in response to the control voltage. At least one current controlled oscillator generates an oscillating frequency output in response to the control current. At least one compensation branch is coupled to the voltage-to-current converter for generating a compensation current that increases the control current when the control voltage exceeds a predetermined value.

The construction and method of operation of the invention, however, together with additional objectives and advantages thereof will be best understood from the following description of specific embodiments when read in connection with the accompanying drawings.

DESCRIPTION

Figure 1:
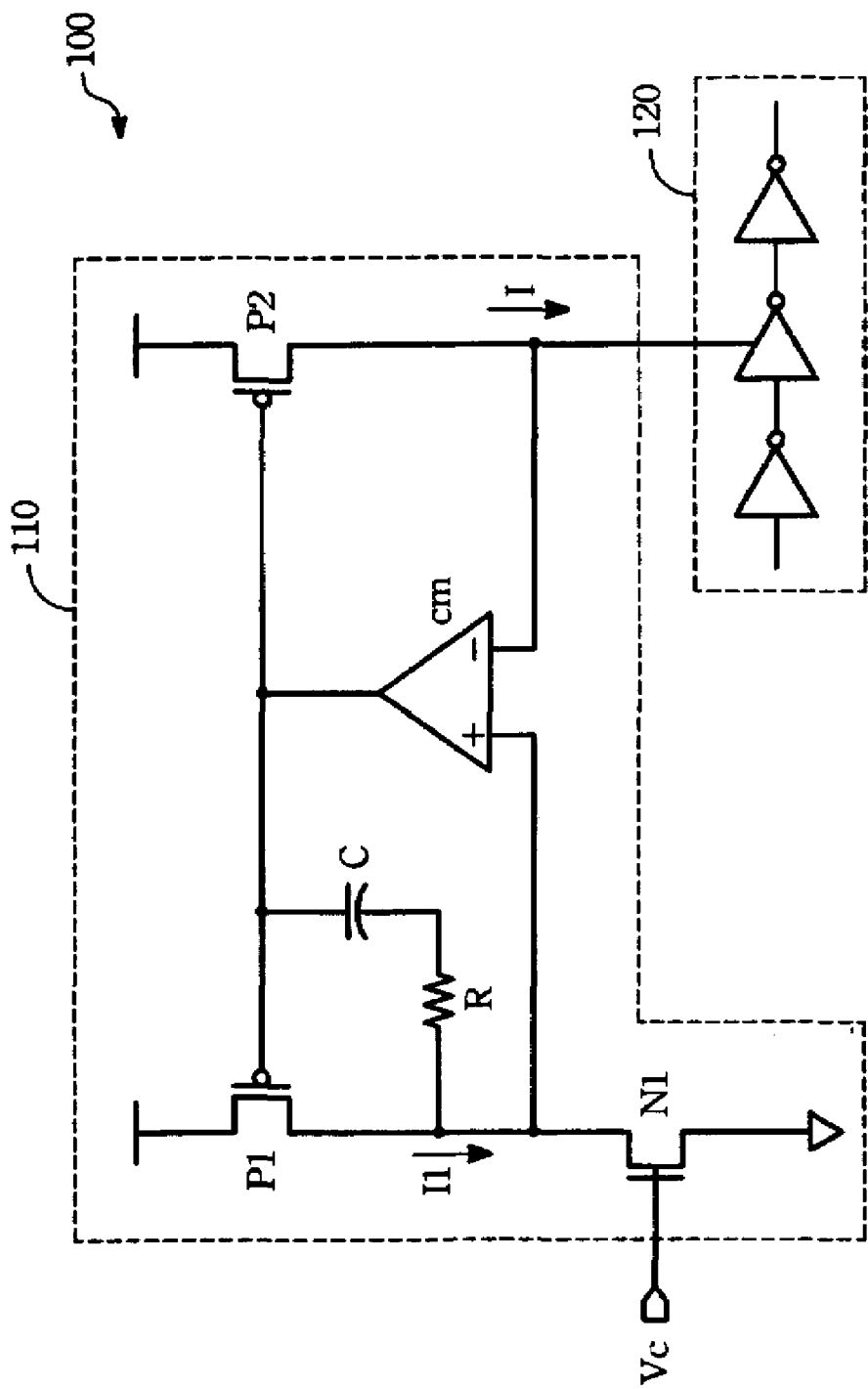
FIG. 1 schematically illustrates a conventional VCO.

FIG. 1 schematically illustrates a conventional VCO 100 for a PLL circuit. The VCO 100 includes a voltage-to-current converter 110 and a current-controlled oscillator 120. The voltage-to-current converter 110 includes a current source N1 and PMOS transistors P1, P2. The control voltage Vc sets the current passing through the current source N1. The current is mirrored by PMOS transistors P1 and P2. As the control voltage Vc is varied, the current I1 and I also vary. The current I at the input to the current-controlled oscillator 120 controls the operating frequency F. The gain of the VCO 100 is defined as the change in oscillator output frequency Δf to the change in the input control voltage ΔV and is given by $$K_{vco} = \Delta f / \Delta V \qquad (1)$$

where $K_{vco}$ is the gain of the VCO. Thus, Kvco is proportional to Δf.

In order to maintain the stability of VCO 100, the loop bandwidth Wn must not exceed ⅙ of the comparison frequency Fref. The relation is given by $$Fref/6 > Wn\alpha \sqrt{\frac{IcpKvco}{NC}} \qquad (2)$$

where C is the capacitance, Wn is the loop bandwidth, Icp is a charge pump current, and N is a predetermined number that stands for a feedback dividing number. The loop bandwidth Wn is fixed to maintain the phase margin, when the VCO gain $K_{vco}$ increases, the capacitance C also must increase to maintain the stability. Increase in capacitance C leads to an increase in the area of VCO.

Figure 2:
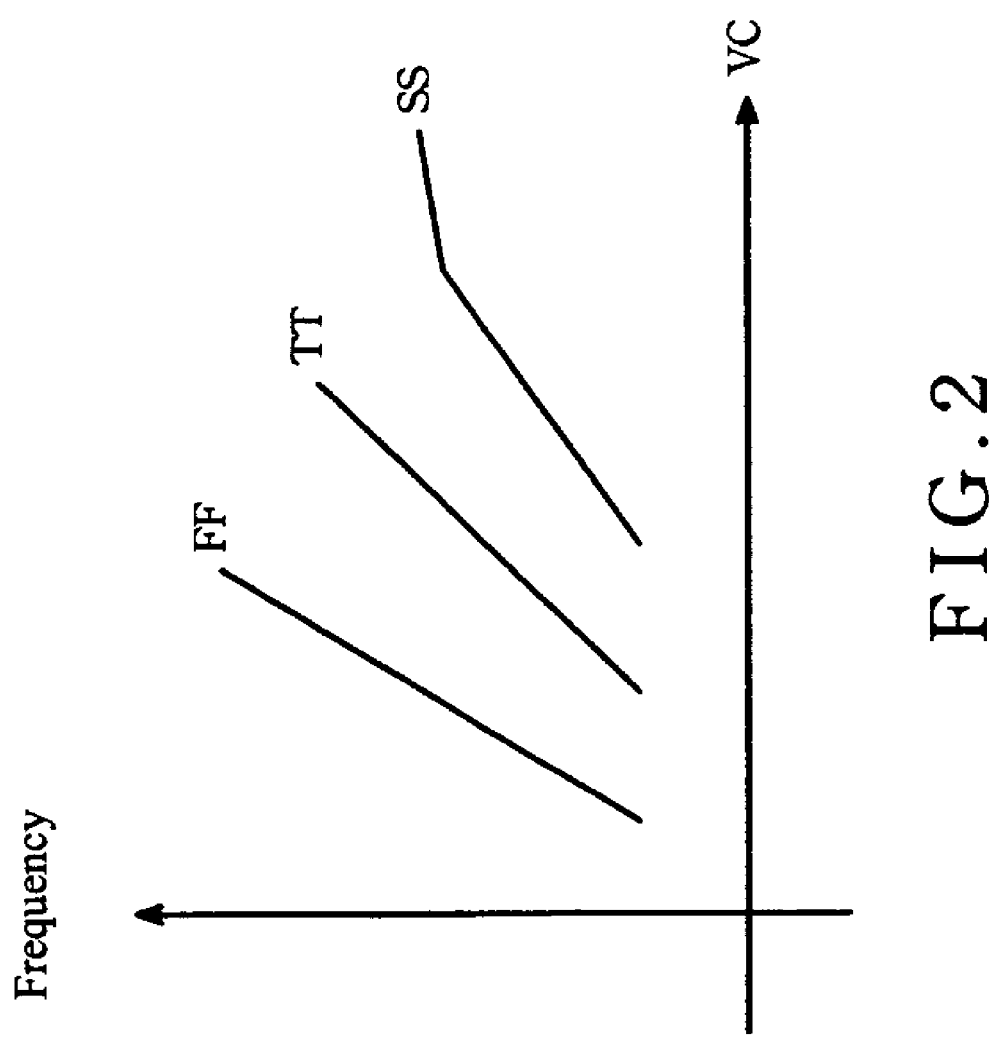
FIG. 2 graphically illustrates the relation between the control voltage and frequency of various corners for the conventional VCO.

FIG. 2 graphically illustrates the relation between control voltage and frequency of the SS, FF and TT corners for the conventional VCO. As shown in the graph, frequency of the SS corner saturates at high voltages. Because of the frequency saturation of the SS corner, the gain diversity from the SS corner to the FF corner is large, thereby causing a sever phase margin degradation.

One conventional scheme for adjusting the SS corner to meet the minimum requirement is to increase the gain of the VCO. However, increasing the gain of the VCO leads to an increase in the gain not only for the SS corner, but also for the FF corner and TT corner. According to equation 2, the loop bandwidth is proportional to the gain of the VC, which must be a value less than ⅙ of the frequency Fref in order to maintain the system's stability. Thus, in order to compensate for the increase in the gain of the VCO, the capacitance needs to be increased, thereby causing the circuit area to increase.

As such, it is desirable to have a VCO, in which the Kvco of the SS corner is increased, while the Kvco of the TT and FF corners remain unchanged.

Figure 3:
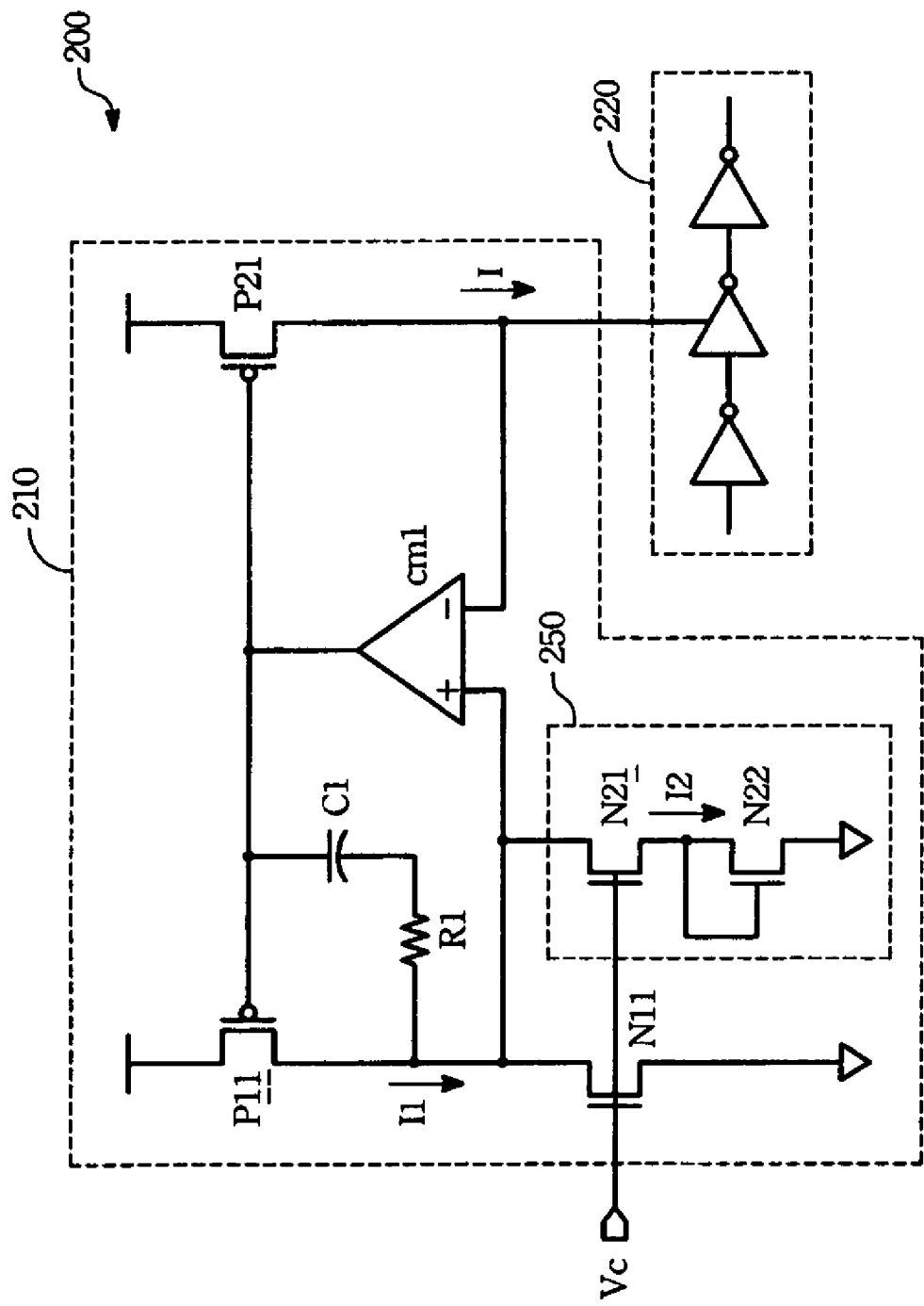
FIG. 3 schematically illustrates a VCO in accordance with one embodiment of the present invention.

FIG. 3 schematically illustrates a VCO 200 in accordance with one embodiment of the present invention. The VCO 200 includes a voltage-to-current converter 210 and a current-controlled oscillator 220. The voltage-to-current converter 210 includes a current source N11, a compensation branch 250 and PMOS transistors P11, P21. The compensation branch 250 includes transistors N21, N22 connected in a cascode pattern. The control voltage Vc sets the current in the current source. The current is mirrored by PMOS transistors P11 and P21. As the control voltage Vc is varied, the currents I1 and I also vary. The current I at the input to the current-controlled oscillator 220 controls the operating frequency F.

The compensation branch 250 includes NMOS transistors N21 and N22. The NMOS transistor N22 has a source connected to ground, and a gate connected to its drain for providing a voltage drop thereacross. The NMOS transistor N21 is coupled between the NMOS transistor N22 and the drain of the NMOS transistor N11 for providing a voltage drop thereacross. The NMOS transistors N21 and N22 together provide an additional current path, which can be turned on when the control voltage Vc exceeds a predetermined value ($2V_T$). The predetermined value can be adjusted so that the NMOS transistor N22 is not turned on for the FF and TT corner. When the control voltage Vc exceeds a point where the Kvco saturates for the SS corner, the NMOS transistor N21 is turned on, and an additional current I2 flow from the power supply to ground. This additional current I2 increases the mirror current I, thereby increasing the oscillation frequency and the Kvco. Thus, the Kvco for the FF and TT corners remains unchanged, while that for the SS corner is increased.

Figure 4:
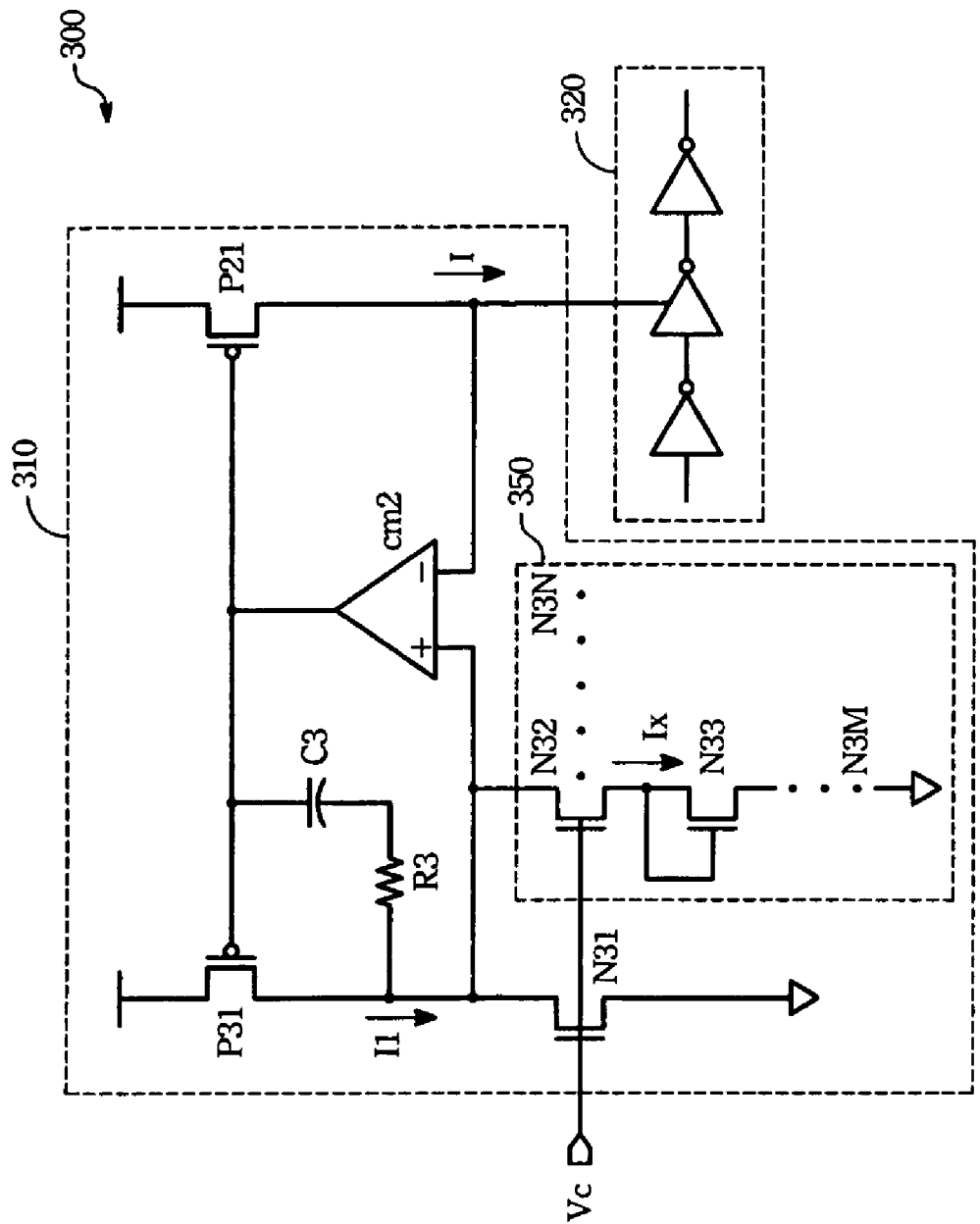
FIG. 4 schematically illustrates a VCO in accordance with another embodiment of the present invention.

FIG. 4 schematically illustrates a circuit for a VCO 300 in accordance with another embodiment of the present invention. The VCO 300 includes a voltage-to-current converter 310 and a current-controlled oscillator 320. The voltage-to-current converter 310 includes a current source N31, compensation branch 350, and PMOS transistors P31, P32. The control voltage Vc sets the current in the current source. The current is mirrored by PMOS transistors P31 and P32. As the control voltage Vc is varied, the currents I1 and I also vary. The current I at the input to the current-controlled oscillator 320 controls the operating frequency F and as the control voltage is varied, the oscillation frequency is varied over a wide range.

The compensation branch 350 includes multiple sub-branches of NMOS transistors each with multiple NMOS transistors arranged in a cascode pattern to increase the gain of the VCO for the SS corner. Each sub-branch includes at least one NMOS transistor N32 having a gate connected to the control voltage Vc, and one or more serially connected NMOS transistors N33, each of which has its gate connected to its drain. The compensation branch 350 can be turned on when the control voltage Vc exceeds a predetermined value. The predetermined value can be adjusted so that the NMOS transistor N32 is not turned on for the FF and TT corner. When the control voltage Vc exceeds a point where the frequency saturates the SS corner, the NMOS transistors N3X are turned on, and an additional current Ix flows from the power supply to ground. This additional current Ix increases the mirror current I, thereby increasing the oscillation frequency and the Kvco. Thus, the Kvco for the FF and TT corners remain unchanged, while that for the SS corner is increased.

The proposed embodiment of the present invention helps maintain stability without increasing the capacitance area. As discussed above, the circuit increases the frequency or prevents against gain degradation of the VCO of the SS corner without increasing the gains of FF and TT corner. This eliminates the need to increase capacitor size to compensate for the increase in gain and thus maintains stability while using lesser area.

The proposed embodiment of the present invention also helps minimize phase margin degradation by reducing the gain diversity between the SS and FF corners.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage controlled oscillator comprising:
    at least one input port for receiving a control voltage;
    at least one voltage-to-current converter coupled to the input port for generating a control current in response to the control voltage, wherein the voltage-to-current converter further comprises;
    at least one first NMOS transistor having a gate terminal controlled by the control voltage at the input port;
    a first PMOS transistor with a source connected to a supply voltage, a drain connected to a drain of the first NMOS transistor; and
    a capacitor and resistor serially connected to a gate and the drain of the first PMOS transistor;
    at least one current controlled oscillator for generating an oscillating frequency output in response to the control current; and
    at least one compensation branch coupled to the voltage-to-current converter for generating a compensation current that increases the control current when the control voltage exceeds a predetermined value, wherein the compensation branch comprises a second NMOS transistor having a gate terminal controlled by the control voltage at the input port and a drain terminal connected to the drain terminal of the first NMOS transistor.

2. The voltage controlled oscillator of claim 1, wherein the compensation branch comprises a third NMOS transistor with its drain and gate tied together and connected to the source of the second NMOS transistor and its source connected to the ground.

3. The voltage controlled oscillator of claim 1, wherein the voltage-to-current converter comprises a second PMOS transistor with a source connected to the supply voltage, a gate connected to the gate of the first PMOS transistor, and a drain connected to the current controlled oscillator.

4. A voltage controlled oscillator comprising:
    at least one input port for receiving a control voltage;
    at least one voltage-to-current converter coupled to the input port for generating a control current in response to the control voltage, wherein the voltage-to-current converter further comprises;
    at least one first NMOS transistor having a gate terminal controlled by the control voltage at the input port;
    a first PMOS transistor with a source connected to a supply voltage, a drain connected to a drain of the first NMOS transistor; and a capacitor and resistor serially connected to a gate and the drain of the first PMOS transistor;

at least one current controlled oscillator for generating an oscillating frequency output in response to the control current; and a compensation branch having one or more sub-branches, each of which has at least one first NMOS transistor with its gate controlled by the control voltage and one or more second NMOS transistors serially coupled to the first NMOS transistor for generating a compensation current that increases the control current when the control voltage exceeds a predetermined value.

5. The voltage controlled oscillator of claim 4, wherein the second NMOS transistor has its gate connected to its drain.

6. The voltage controlled oscillator of claim 4, wherein the predetermined value is determined by a total number of the first and second NMOS transistors.

7. The voltage controlled oscillator of claim 4, wherein the second NMOS transistor has its drain and gate tied together and connected to the source of the first NMOS transistor and its drain connected to the ground.

8. A voltage controlled oscillator comprising:

at least one input port for receiving a control voltage;

at least one voltage-to-current converter coupled to the input port for generating a control current in response to the control voltage, the voltage-to-current converter having at least one current mirror having a first PMOS transistor coupled between the voltage-to-current converter and a power supply, and a second PMOS transistor with a source coupled to the power supply and a gate coupled to the gate of the first PMOS transistor for generating a mirror current mirroring the control current at a drain of the second PMOS transistor, wherein the voltage-to-current converter further comprises;

at least one first NMOS transistor having a gate terminal controlled by the control voltage at the input port; and a capacitor and a resistor serially connected between a gate of the first PMOS transistor and a drain of the first NMOS transistor;

at least one current controlled oscillator for generating an oscillating frequency output in response to the mirror current; and at least one compensation branch coupled to the voltage-to-current converter for generating a compensation current that increases the mirror current when the control voltage exceeds a predetermined value.

9. The voltage controlled oscillator of claim 8, wherein the compensation branch comprises a second NMOS transistor having a gate terminal controlled by the control voltage at the input port, a drain terminal connected to the drain terminal of the first NMOS transistor.

10. The voltage controlled oscillator of claim 9, wherein the compensation branch comprises a third NMOS transistor with its drain and gate tied together and connected to the source of the second NMOS transistor and its source connected to the ground.

* * * * *